US005681205A

United States Patent [19]

Yam

[11] Patent Number: 5,681,205
[45] Date of Patent: Oct. 28, 1997

[54] METHOD OF USING ABRASIVE BLAST MEDIA CONTAINING CORROSION INHIBITOR

[75] Inventor: Benny S. Yam, Holmdel, N.J.

[73] Assignee: Church & Dwight Co., Inc., Princeton, N.J.

[21] Appl. No.: 426,581

[22] Filed: Apr. 21, 1995

Related U.S. Application Data

[63] Continuation-in-part of Ser. No. 370,801, Jan. 10, 1995, which is a continuation-in-part of Ser. No. 105,406, Aug. 12, 1993, Pat. No. 5,384,990.

[51] Int. Cl.$^6$ .................................................. B24C 1/00
[52] U.S. Cl. .................................................. 451/39; 450/40
[58] Field of Search ........................... 15/95; 134/7, 32; 451/36, 38, 39, 40, 60, 446

[56]  References Cited

U.S. PATENT DOCUMENTS

| | | | |
|---|---|---|---|
| 2,817,195 | 12/1957 | Curtin . | |
| 2,900,222 | 8/1959 | Kahler et al. | 21/2.7 |
| 3,142,590 | 7/1964 | Hergonson | 134/7 |
| 3,484,995 | 12/1969 | Gordon | 451/39 |
| 4,324,684 | 4/1982 | Geiger et al. | 252/389 |
| 4,347,152 | 8/1982 | Wixon | 252/174 |
| 4,729,770 | 3/1988 | Higgins . | |
| 4,771,580 | 9/1988 | Male | 451/102 |
| 5,160,547 | 11/1992 | Kirschner et al. | 134/7 |
| 5,317,841 | 6/1994 | Cook et al. | 451/40 |
| 5,384,990 | 1/1995 | Spears, Jr. | 451/38 |

FOREIGN PATENT DOCUMENTS 1491682  7/1989  U.S.S.R. .

*Primary Examiner*—Timothy V. Eley
*Attorney, Agent, or Firm*—Irving M. Fishman

[57] ABSTRACT

A blast media is provided for cleaning a metal surface by wet blasting and which comprises a particulate abrasive such as sodium bicarbonate and a corrosion inhibitor comprising an alkali metal phosphate. The corrosion inhibitor has been found to greatly reduce the discoloration of metals which have been wet blasted with alkaline salt abrasives.

24 Claims, No Drawings

METHOD OF USING ABRASIVE BLAST MEDIA CONTAINING CORROSION INHIBITOR

This application is a continuation in part of U.S. Pat. No. 370,801, filed Jan. 10, 1995, which is a continuation-in-part of U.S. Pat. No. 105,406, filed Aug. 12, 1993, now U.S. Pat. No. 5,384,990, issued Jan. 31, 1995.

FIELD OF THE INVENTION

The present invention relates to improvements in wet blasting to remove adherent materials such as paint, scale, dirt, grease, oil and the like from solid surfaces, in particular, metal surfaces. More particularly, the present invention is directed to a novel abrasive blast media comprising a water-soluble abrasive and a corrosion inhibitor.

DESCRIPTION OF THE PRIOR ART

In order to clean a solid surface to preserve metal against deterioration, remove graffiti from stone or simply to degrease or remove dirt or other coatings from a solid surface, it has become common practice to use an abrasive blasting technique wherein abrasive particles are propelled by a fluid against the solid surface in order to dislodge previously applied coatings, scale, dirt, grease or other contaminants. Such abrasive blasting has been used favorably, for example, to degrease metal and has replaced the environmentally unsafe solvent treatments.

Various abrasive blasting techniques have been used to clean a surface including dry blasting which involves directing the abrasive particles to the surface by means of pressurized air, wet blasting in which the abrasive blast media is directed to the surface by a pressurized stream of water, and a process in which both air and water are utilized either in combination at sufficient pressures to propel the abrasive blast media to the surface as disclosed in U.S. Pat. No. 4,817,342, or in combination in which relatively low pressure water is used primarily as a dust control agent or to control substrate damage.

The blast media or abrasive particles most widely used for blasting surfaces either by dry or wet blasting to remove adherent material therefrom is sand. Sand is a hard abrasive which is very useful in removing adherent materials such as paint, scale and other materials from metal surfaces such as steel. While sand is a most useful abrasive for each type of blasting technique, there are disadvantages in using sand as a blast media. For one, sand, i.e., crystalline silica, is friable and upon hitting a metal surface will break into minute particles which are small enough to enter the lungs. These minute silica particles pose a substantial health hazard. Additionally, much effort is needed to remove the sand from the surrounding area after completion of blasting. Still another disadvantage is the hardness of sand itself. Thus, sand cannot readily be used as an abrasive to remove coatings from relatively soft metals such as aluminum, or non-metallic substrates such as plastic, plastic composite structures, concrete or wood, as such relatively soft substrates can be excessively damaged by the abrasiveness of sand. Moreover, sand cannot be used around moving parts of machinery inasmuch as the sand particles can enter bearing surfaces and the like.

An alternative to sand as a blast media, particularly, for removing adherent coatings from relatively soft substrates such as softer metals as aluminum, or composite surfaces and the like is sodium bicarbonate. While sodium bicarbonate is softer than sand, it is sufficiently hard to remove coatings from metal surfaces and as well remove coatings including paint, dirt, and grease from non-metallic surfaces without harming the substrate surface. Sodium bicarbonate is not harmful to the environment and is most advantageously water soluble such that the particles which remain subsequent to blasting can be simply washed away without yielding environmental harm. Since sodium bicarbonate is water soluble and is benign to the environment, this particular blast media has found increasing use in removing coatings and cleaning dirt, grease and oil and the like from metal surfaces and as a replacement for solvent cleaning processes.

Sodium bicarbonate is also a friable abrasive and, like sand, will form a considerable amount of dust during the blast cleaning process. To control the dust formed by the sodium bicarbonate blast media as it contacts the targeted surface, water has been used as the pressurized fluid stream to carry the sodium bicarbonate particles to the target surface or included in the compressed air carrier medium either internally in the nozzle or directed as an external stream onto or surrounding the stream of the abrasive particles for dust control. Each of these processes is considered wet blasting.

Wet blasting to remove coatings and other contaminants from solid surfaces using a water stream either alone, or preferably, in conjunction with an abrasive blast media has advantages of economy over utilizing a dry blasting technique in which compressed air is used as the carrier for the blast media from the nozzle structure to the targeted surface. It is relatively easy to pump the water carrier to the pressures utilized in the wet blasting technique. On the other hand, the compression equipment needed to compress air to even the modest pressures utilized in the dry blasting technique is quite expensive.

Various techniques are known for introducing a particulate abrasive into a water stream, for example, by introduction of a separate air stream which carries the particulate abrasive into the throat of a venturi-type blast nozzle through which the water carrier is passing, or by mixing the particulate abrasive/air stream exterior of a blast nozzle means with the liquid-stream as disclosed in U.S. Pat. No. 4,125,969. For convenience of operation, the particulate abrasive and water have conventionally being allowed to mix while traveling through the interior of the blast nozzle which is used to direct the abrasive/water mixture to the work surface at high velocity.

The cleaning of metal with a wet blasting technique is problematic since water can be corrosive to a variety of metal substrates such as iron-containing substrates. The corrosion problem is exacerbated if water soluble alkaline salts such as sodium bicarbonate are utilized as the abrasive blast media as the alkalinity of the aqueous stream can increase the corrosiveness of the wet blasting treatment relative to a variety of metal substrates including iron-containing substrates, aluminum and zinc-containing substrates and the like. However, in view of the advantages of the wet blasting technique, in particular, with water soluble abrasive as described above, the use of wet blasting to remove contaminants such as paint, scale, dirt, grease, oil from metal substrates is gaining increased use, in particular, for cleaning used automotive or aircraft parts and components.

Corrosion inhibitors have been added to abrasive blast media. Typically, the corrosion inhibitor is added to the water stream. This is disclosed for example in U.S. Pat. No. 4,125,969 mentioned above. Such a process adds cost to the wet blasting process as a separate continuous supply of the corrosion inhibitor must be provided and means must be provided to accurately dispense the corrosion inhibitor in the separate water stream. It would be most advantageous therefore to provide a useful corrosion inhibitor which could be added with dry abrasive so as to allow easy handling and one-step dispensing of the abrasive and the corrosion inhibitor into the fluid carrier stream.

Accordingly, it is an object of the present invention to provide a wet blasting technique for cleaning metal surfaces and which would protect the metal surface from corrosion.

It is another object of the present invention to provide an abrasive media which is effective to remove contaminants from a surface and provide sufficient corrosion protection to metal surfaces upon being directed to the surface by a wet blast technique.

It is still another object of the present invention to provide an abrasive blast media which will remove contaminants from a metal surface and provide corrosion protection to the metal surface, in particular, when the metal surface contains zinc.

These and other objects of the invention will become readily apparent upon consideration of the specification as a whole including, but not limited to the detailed description of the invention and appended claims.

SUMMARY OF THE INVENTION

The present invention is directed to improvements in wet blasting processes for removing coatings or other contaminants from metal surfaces. The objects of the invention as described above are achieved by adding a water soluble corrosion inhibitor with the abrasive particles to form an abrasive blast media. The blast media is carried to the surface in a pressurized fluid stream which comprises water as a carrier for the abrasive or added either internally and externally from a blast nozzle as a dust control agent. Preferably, the abrasive particles are water soluble and the pressurized fluid stream comprises a saturated aqueous solution to form a slurry. The saturated solution used to form the slurry insures that the particulate abrasive will not readily dissolve prior to contact with the targeted surface and that such particles will substantially retain the original geometry and the inherent abrading efficiency thereof.

The corrosion inhibitor for use in the blast media of this invention is an alkali metal phosphate which has been found to be effective in preventing corrosion of sensitive metal substrates subsequent to wet blast cleaning, in particular, if the abrasive is a water soluble alkaline salt such as sodium bicarbonate.

DETAILED DESCRIPTION OF THE INVENTION

The abrasive particles to be utilized in the blast media and dispersed within the pressurized fluid stream for wet blasting are preferably water soluble. The pressurized fluid stream is preferably water although compressed air can be used and water added inside or outside the nozzle to or around the fluid stream as a dust control agent. The abrasive typically will be in the form of a powder having an average size range of from about 10 to 1,000 microns in diameter. Preferably, the abrasive particles will have an initial average size of from about 50–500 microns. The amount of abrasive particles having a size of greater than 1,000 microns in diameter is preferably less than 1% of the abrasive particles. Upon recycle and reuse, the particles will preferably have a size of at least about 15 microns. Water soluble abrasive particles are advantageous since such blast media can be readily rinsed off the cleaned surface, can be readily disposed of by a water stream, are readily separated from the insoluble paints and resins which have been stripped to facilitate waste disposal, and since most water soluble blast media are relatively soft, i.e., Mohs hardness less than 4.0, such media can be utilized to remove coatings, grease, dirt and the like from a variety of substrates including hard metals such as steel and, importantly, relatively soft metals such as aluminum and the like. Water soluble blast media having a Mohs hardness of less than 5.0 are generally useful in this invention, in particular, for cleaning softer substrates.

Although not preferred, the abrasive particles may comprise insoluble abrasives such as sand, alumina, glass beads, steel shot, calcium carbonate, etc. to improve efficacy of cleaning, especially if the object to be cleaned is grossly contaminated and if the surface is hard enough to withstand the blast cleaning process using the harder abrasives. The insoluble abrasives can also be used in admixture with the water soluble abrasives in preferred amounts of 1 to 50 wt. % relative to the total abrasive used.

Non-limiting examples of water soluble abrasives which can be utilized in the blast media of this invention include the alkali metal and alkaline earth metal salts such as the chlorides, chlorates, carbonates, bicarbonates, sesquicarbonates, Sulfates, silicates, the hydrates of the above, etc. The preferred abrasive particles are alkali metal salts and, in particular, sodium and potassium carbonates, bicarbonates, sesquicarbonates and sulfates. The most preferred abrasive to be incorporated into the blast media are the alkali metal bicarbonates as exemplified by sodium bicarbonate. Such a bicarbonate-based blast media is marketed under the tradename ARMEX® by Church & Dwight Co., Inc., Princeton, N.J. Also preferably useful are sodium sesquicarbonate, natural sodium sesquicarbonate known as trona, sodium carbonate, potassium carbonate and potassium bicarbonate. Also useful are sodium chloride and sodium sulfate which latter sodium salt is described in commonly assigned U.S. Pat. No. 5,112,406. It is important to note that by water soluble is not meant completely water soluble as some salts and natural minerals such as trona may contain minor amounts of insoluble materials. For example, trona which is a natural sodium sesquicarbonate may contain up to 10 wt. % of insolubles. Thus, by water soluble is meant to include those materials which are substantially soluble in water.

The blast media of the present invention further includes a corrosion inhibitor which is water soluble and can be added to the abrasive particles. Preferably, the corrosion inhibitor is a solid so that the blast media of the present invention comprises a mixture of individual solid particles which can be formulated and directed as a free flowing mixture into the fluid carrier stream. The corrosion inhibitor which is used in the blast media of this invention is particularly effective in providing corrosion protection including protection against discoloration of sensitive metals such as aluminum and zinc and further, magnesium, copper, brass, etc. The corrosion inhibitor is particularly effective when mixed with an alkaline salt abrasive. In such a case, the aqueous carrier or dust control stream becomes alkaline especially if a saturated solution of the aqueous stream is utilized as the pressurized fluid stream which carries the blast media to the targeted surface. The alkaline aqueous stream has a tendency to discolor sensitive metals. In particular, the corrosion inhibitor which is added to the abrasive particles to form the blast media of this invention comprises alkali metal orthophosphates, polyphosphonates, phosphonates or mixtures thereof. Alkali metal orthophosphates include the sodium and potassium orthophosphates and their hydrates. Alkali metal polyphosphates include sodium and potassium metaphosphates, pyrophosphates, and tripolyphosphates. Phosphonates include 1-hydroxyethane-1, 1, diphosphonic acid, aminiotrimethylenephosphonic acid, 2-hydroxyethyliminobismethylenephosphonic acid, diethylenetriaminepentakismethylenephosphonic acid, etc., their sodium and potassium salts. Sodium and potassium orthophosphates are particularly useful including the mono, dibasic and tribasic orthophosphate salts. Particularly preferred is sodium orthophosphate, monobasic and dibasic. Zinc salts can be added to further improve the corrosion inhibiting properties of the phosphate corrosion inhibitors. Zinc salts include zinc oxides, sulfates, nitrates, carbonates, bicarbonates, chlorides, phosphates, molybdates, etc. Zinc phosphate may be formed in-situ in the blast stream or on the substrates surface by reaction of the phosphate and soluble zinc salt. The amount of zinc should be limited for environmental reasons to no more than 1,000 ppm (as zinc) in the water stream whether present or the pressurized fluid stream or as a dust control agent. Lower levels are preferably used i.e., below 100 ppm.

The alkali metal phosphate can be provided as a solid or liquid in the blast media. If liquid, the corrosion inhibitor is preferably sprayed onto the abrasive particles. A separate liquid addition of the corrosion inhibitor such as to the water stream can be used, although such method is not preferred. More preferably, the corrosion inhibitor will be provided as a separate solid and have a particle size which is compatible with that of the abrasive particles and the flowability of the blast media, in general. What this means is that the particle size of the corrosion inhibitor should not be so small or so large as to inhibit the relatively uniform mixture of abrasive particles and corrosion inhibitor and should be of size to allow the free flow of the blast media mixture from any supply structure, through metering orifices, conveying hoses and eventually through the blast nozzle. In general, the corrosion inhibitor will have a size range similar to or less than that of the abrasive particles. Large corrosion inhibitor particles will not be uniformly mixed with the abrasive particles and cause segregation of the particles forming the blast media. Preferably, the alkali metal phosphate particles are no greater than 100 microns.

The alkali metal phosphate corrosion inhibitor is added to the blast media in amounts ranging from 0.03–5 wt. % relative to the total weight of the blast media. Preferably, the corrosion inhibitor is added in amounts of 0.05–2.0 wt. % and more preferably from about 0.08–2.0 wt. % relative to the blast media.

The alkali metal phosphates including the preferred orthophosphate have been found to be stable in the blast media which contains a sodium bicarbonate abrasive from the supply pot to the target surface and have provided corrosion protection and protection against discoloration for very sensitive substrates such as cast aluminum and zinc-containing metals after the slurry blast. Other corrosion inhibitors have not been found to be as effective or as stable with the preferred sodium bicarbonate abrasive. For example, it has been found that sodium silicate, a known corrosion inhibitor for metal is incompatible with certain of the alkaline salt abrasives, in particular, sodium bicarbonate. Thus, the silicate will react with the bicarbonate salt even in the solid state resulting in large and uneven insoluble, polymerized solids which hinder uniform flow of media through the blast cleaning equipment and reduce effectiveness of abrading and corrosion or discoloration protection.

Since the preferred abrasive particles of the blast media of the present invention are water soluble, the addition of such particles into a pressurized fluid stream comprising water for projection onto a targeted surface can often reduce the abrasive nature of the particles. Thus, it is preferred in accordance with the wet blasting process of the present invention that the pressurized aqueous stream which carries the abrasive particles comprise a saturated solution and the blast stream comprise a slurry formed of the abrasive particles and the saturated aqueous solution. This process is described in commonly assigned U.S. Pat. No. 5,384,990 and copending U.S. application Ser. No. 370,801 filed Jan. 10, 1995.

In accordance with the wet blasting processes disclosed therein, any of the liquid streams which carry the abrasive particles can comprise a saturated solution. Preferably, the saturated solution is formed from dissolved abrasive material. The saturated solution forming the liquid carrier insures that the abrasive particles which are added to the carrier liquid to enhance the abrasive nature thereof do not readily dissolve and retain the geometry and abrasive nature thereof during the blast cleaning process. Thus, all of the liquid streams which contain the abrasive particles preferably comprise saturated solutions including any liquid stream which carries the abrasive particles from the source of supply to the primary particle accelerator stream as well as the liquid accelerator stream which is mixed prior to the nozzle with the particulate abrasive or directed separately to the nozzle and mixed with abrasive particles at the nozzle prior to being directed to the targeted surface. If the liquid accelerator stream is provided separately to the blast nozzle, the abrasive particles can be added to this liquid stream by aspiration, by means of compressed air or by admixture in a slurry in which the liquid carrier for the supply of abrasive particles is also a saturated solution so as to minimize dissolution of the abrasive particles from the supply source. Preferably, the abrasive particles are mixed with a saturated solution prior to the nozzle and this slurry is pumped to sufficient pressure such as by a piston driven positive displacement pump to the nozzle apparatus and subsequently to the targeted surface.

The liquid accelerator stream is preferably water although other liquids can be utilized. For example, glycerin has been utilized as a carrier fluid in blasting operations and is useful since it tends to maintain an even distribution of the particulates therein relative to water in which the particulates tend to settle out. Other water soluble polymeric materials can be used as the carrier liquid or, preferably, as an additive to water to affect the viscosity, specific gravity or surface tension thereof. These water soluble polymers are typically marketed as dust control additives. However, in view of the ease of use, expense with respect to the blast cleaning process and the clean-up of the spent media, water is preferred as the liquid carrier. With water as a carrier, the water soluble abrasive media described above can be used. For example, saturated solutions of sodium bicarbonate and water will comprise from about 7 to about 20% of the sodium bicarbonate depending upon the temperature of the water stream. If sodium carbonate or potassium carbonate are utilized as the blast media, substantially higher levels of these materials must be dissolved in the water stream to obtain a saturated solution. The relative dissolution of the abrasive media described above or other materials in water are readily obtainable from published literature. The water stream can alternatively be saturated with dissolved media other than the abrasive added to form the slurry. Thus, any soluble salt such as alkaline salts other than the abrasive can be added to the water carrier to form a saturated solution.

Once the liquid carrier stream or streams are saturated with the dissolved abrasive media or other salts, the abrasive media particles can be added therein to form a slurry with minimal dissolution of the added particles. The abrasive particles can be added by gravity as from a hopper, or carried to the saturated solution either by a compressed air stream or by admixture in a second saturated solution. The slurry is preferably formed prior to the blast nozzle as described above and pumped to the pressure required for blast cleaning. Alternatively, separate streams of the saturated liquid carrier and abrasive particles can be directed to the blasting apparatus and mixed therein prior to discharge to the targeted surface. The method of mixing the abrasive particles into the liquid carrier is not a critical feature of the invention. The corrosion inhibitor is added and mixed with the abrasive particles and the mixture added to the liquid carrier by any of the means just described. Preferably, the blast media comprising a mixture of abrasive particles and corrosion inhibitor particles is formed and placed in the supply hopper as a formed mixture.

The blasting equipment used in the wet blasting process of the present invention can be any of the conventional blasting equipment presently used. Examples include the blasting apparatus disclosed in U.S. Pat. No. 4,817,342 and U.S. Pat. No. 4,125,969. Typically, the wet blasting equipment comprises a venturi nozzle in which the pressurized fluid is accelerated by passage through a restricting orifice and directed to the targeted surface through an expanding outlet section of the nozzle. Usually, the venturi nozzle is a hand held device, although, automatic operation may be useful in some situations.

Various types of specific equipment can be used including high pressure water blasting equipment such as "Aqua-Dyne® high pressure water jet blaster" and "Dyna-Grip" wet abrasive blast system from Aqua-Dyne Incorporated, Houston, Tex. and "Aqua-Miser" blasting equipment for Carolina Equipment and Supply Company, Inc., North Charleston, S.C. which is described in U.S. Pat. No. 5,220,935 herein incorporated by reference. The above mentioned blasting apparatus mix the blast media particles entrained in a compressed air stream with a separate high pressure liquid stream. The liquid stream and particulate stream are mixed at the nozzle. Typically, such wet blasting equipment utilizes liquid pressures of at least about 500 psi and, more typically, greater than about 3,000 psi, even upward to about 40,000 psi.

Alternative equipment and processes can be used to add the abrasive to the liquid stream. For example, as previously stated, a slurry of the blast media particles and liquid carrier can be formed and pumped to the desired pressure prior to entering the blast nozzle. The slurry can also be pumped to an intermediate pressure and then directed to the venturi-type nozzle to increase pressure and velocity of the blast medium. Further alternatives include adding a slurry of blast media particles and liquid carrier to either a compressed air or pressurized water accelerator stream at the blast nozzle. As an example, the "Vapormatt" blast cleaning system from Kleiber and Schulz, Inc. Melville, N.Y., is a system wherein a slurry of insoluble abrasive in water is accelerated in a blast nozzle by compressed air. Such a system can be easily modified to form the slurry of an aqueous solution and a water soluble blast media as described above.

Instead of the high pressure Aqua-Dyne®, Aqua-Mixer and like blasting equipment described above, lower water pressure equipment are available and can be used to direct the slurry of water soluble blast media and aqueous solution to the targeted surface. Thus, it has been found that equipment for directing the slurry to the targeted surface at relatively low pressures below 500 psi and even below 125 psi are available or can be made and can effectively remove dirt, grease or any other contaminant contained on a solid surface. It is believed a system such as the "Vapormatt" cleaning system described above can be used at low slurry pressures. It has further been found that the presence of the abrasive in the slurry allows the blast cleaning to be accomplished effectively at low pressure and at relatively low temperatures such as room temperature. By contrast, currently available aqueous cleaning solutions such as for metal parts and the like require elevated temperatures approaching 190° F. to achieve effective cleaning. Thus, an alternative which allows the slurry to be blasted at low pressure and low temperature can be operated at reduced costs with respect to the specialized equipment needed for high pressure water blasting and over aqueous based cleaners which require high temperatures and consequently additional energy costs.

Other alternatives for directing the slurry of water soluble abrasive and saturated aqueous solution against a targeted surface are available and can be used in accordance with the present invention. Still further, the wet blasting process may be provided from a liquid (water) stream which is used for dust control. In this case the pressurized fluid stream is compressed air typically at pressures of from 30 to 150 psi which entrains the media containing abrasive and corrosion inhibitor and the water is added to or around the compressed air stream.

Since, the blast media of the present invention is wet blasted onto the metal surface, the aqueous stream whether as a pressurized carrier or dust control stream can include other cleaning adjuvants which enhance the cleaning effect or post-treatment characteristics of the substrate. Likewise, the solid blast media can include other water soluble additives.

For example, the blast media of the present invention can include at least one surfactant incorporated therein. The surfactant which may be utilized can be anionic, nonionic or amphoteric in nature or mixtures of the various types of surfactants can be used. The surfactant can be added to the blast media particles or to the aqueous solution. Commonly assigned, U.S. Pat. Nos. 5,316,587, issued May 31, 1994 and 5,332,447, issued Jul. 26, 1994, both incorporated herein by reference, describe the types of surfactants which can be added to a blast media.

The surfactants can be added merely to enhance removal of abrasive residues which remain on the target surface or can be added to enhance cleaning of the substrate by means of the detersive action of the surfactants. The amount of surfactant needed to provide reduced residue content and easily rinsed residues is extremely small in most cases and, thus, will range from about finite levels to about 3 wt. %, preferably about 0.05 to about 1 wt. %, and, more preferably, from about 0.05 to 0.5 wt. % of the blast media particles. At such levels the surfactant can be added to the blast media particles by the methods set forth in the above-mentioned commonly assigned patents. Surfactant levels provided to aid in removing any dirt, grease or oil from the substrate can be much higher and, thus, range from about 0.1 to 30 wt % relative to the blast media. At such levels, the surfactant can be added effectively in the aqueous phase of the wet blasted media such as the slurry blast media in aqueous carrier. Nonionic surfactants appear to best provide the additional detersive action. It may be possible to provide several kinds of surfactants with the blast media including those most readily able to reduce residue formation such as anionic surfactants and nonionic surfactants most capable of enhancing the removal of dirt, grease or oil from the substrate. The surfactants added to the slurry also advantageously solubilize the dirt and grease allowing easier clean up and reduces the deflection of dirt from one surface to another. Antifoam agents can be added to the media which contains surfactants to reduce any foaming on the target surface during blast cleaning, especially if a slurry blasting process is utilized. Any conventional antifoam agents can be utilized such as ethoxylated alcohol surfactants as well as silicones well known in the art.

Further agents which enhance cleaning efficacy or provide a post-treatment to the target surface can be added to the blast stream by direct addition to the aqueous stream or added to the blast media particles. For example, soluble alkaline salts can be added to the aqueous solution to increase solution pH or act as builder salts to improve removal of soil, greases, oils, etc. from the substrate being cleaned. Such salts can include alkali metal carbonates, bicarbonates, the hydrates thereof, sesquicarbonates, ortho or complex phosphates such as pyrophosphate, tripolyphosphate as well as the alkali metal borates, acetates, citrates, tartrates, gluconates, succinates, silicates, phosphonates, nitrilotriacetates, edates, etc.

It may be useful in accordance with the present invention to include a flow aid or a decaking agent with the blast media. Most preferably, the flow aid is a hydrophilic silica, hydrophobic silica, hydrophobic polysiloxane or mixture thereof.

Hydrophobic silica, unlike known hydrophilic silicas, is substantially free of non-hydrogen bonded silanol group and absorbed water. One preferred hydrophobic silica which may be utilized in the blasting media hereof is Aerosil R 972, a product which is available from DeGussa AG. This material is a pure coagulated silicon dioxide aerosol, in which about 75% of the silanol groups on the surface thereof are chemically reacted with dimethyldichlorosilane, the resulting product having about 0.7 mmol of chemically combined methyl groups per 100 $m^2$ of surface area and containing about 1% carbon. Its particles vary in diameter from about 10 to 40 nanometers and have a specific surface area of about 110 $m^2/gram$. It may be prepared by flame hydrolysis of a hydrophilic silica as more fully described in Angew. Chem., 72, 744 (1960); F-pS 1,368,765; and DT-AS 1,163, 784. Further details respecting such material are contained in the technical bulletin entitled "Basic Characteristics and Applications of AEROSIL", DeGussa AG, August 1986. The hydrophobic silica particles are admixed with the abrasive blasting agent in the proportion of at least about 0.1 and up to about 1.0% by weight thereof. Another hydrophobic silica is Quso, marketed by DeGussa A.G.

Hydrophobic polysiloxanes, preferably non-halogenated polysiloxanes, suitable for use in the blasting media hereof are commercially marketed by Dow Corning and General Electric.

The wet blasting process of the present invention as described above is useful for efficient cleaning or decoating of sensitive metals such as aluminum or aluminum alloys, zinc, magnesium, copper, brass etc. Stainless steel, and structural steel surfaces can also be cleaned.

The structure of the surface to be cleaned can vary widely and is unlimited. Thus, the surface can be a part of complex configuration, sheeting, coils, rolls, bars, rods, plates, discs, pipes, tubes, etc. Such articles can be derived from any source including for home use, industrial use such as from the aerospace industry, automotive industry or the electronic industry, etc.

The type of contaminant which can be removed form the substrates using the process of this invention is unlimited. In general, the process of this invention can be used to remove all types of contaminants including paint, rust, scale, greases, cutting fluids, drawing fluids, machine oils, anti-rust oils such as cosmolene, carbonaceous soils, sebaceous soils, particulate matter, waxes, paraffins, used motor oil, fuels, etc.

EXAMPLE I

The following example tested the ability of various corrosion inhibitors to prevent discoloration of zinc and aluminum metal samples in the presence of an aqueous sodium bicarbonate slurry. Table 1 sets forth the slurry samples which were tested. Hydroflex™ is a blast media which contains sodium bicarbonate abrasive and surfactant marketed by Church & Dwight Company, Princeton, N.J.

The blast media and the corrosion inhibitor were added to water to make a 50% slurry and the slurry was mixed for 5 minutes. The metal samples were immersed in the slurry and the samples removed from the slurry after a given immersion time. The metal samples were then allowed to dry and the degree of discoloration was noted. Tables 2–4 set forth the results of the discoloration test for zinc and aluminum samples.

TABLE 1

| SAMPLE No. | |
|---|---|
| 1. | HydroFlex™ |
| 2. | w/ 0.3% Na Silicate (3.2r, 16% concentration) |
| 3. | w/ 0.5% Na Benzoate (solid) |
| 4. | w/ 0.5% Na Nitrate (solid) |
| 5. | w/ 0.5% Na Orthophosphate, Monobasic (solid) |

TABLE 2

Zinc samples after 5 hours of immersion in slurry

| SAMPLE No. | INHIBITOR NAME | DEGREE OF DISCOLORATION |
|---|---|---|
| 1. | None | Very noticeabily discolored |
| 2. | Na Silicate | Very noticeabily discolored |
| 3. | Na Benzoate | Slightly discolored |
| 4. | Na Nitrate | Slightly discolored |
| 5. | Na Orthophosph. | No discoloration |

TABLE 3

Zinc samples after 2 days of immersion in slurry

| SAMPLE No. | INHIBITIOR NAME | DEGREE OF DISCOLORATION |
|---|---|---|
| 1. | None | Severely discolored |
| 2. | Na Silicate | Severely discolored |
| 3. | Na Benzoate | Severely discolored |
| 4. | Na Nitrate | Severely discolored |
| 5. | Na Orthophosph. | No discoloration |

TABLE 4

Aluminum samples after 2 days of immersion in slurry

| SAMPLE No. | INHIBITOR NAME | DEGREE OF DISCOLORATION |
|---|---|---|
| 1. | None | Severely discolored |
| 2. | Na Silicate | Slightly discolored |

TABLE 4-continued

Aluminum samples after 2 days of immersion in slurry

| SAMPLE No. | INHIBITOR NAME | DEGREE OF DISCOLORATION |
|---|---|---|
| 3. | Na Benzoate | Severely discolored |
| 4. | Na Nitrate | Severely discolored |
| 5. | Na Orthophosph. | None to very slightly discolored |

As can be seen from each of Tables 2,3 and 4 the sodium orthophosphate corrosion inhibitor protected both the zinc and aluminum samples from discoloration better than the other corrosion inhibitors including the sodium silicate.

EXAMPLE 2

In this example, the HydroFlex™ blast media was tested with varying amounts of sodium orthophosphate to determine the effective levels of the corrosion inhbitor for inhibiting discoloration of zinc metal samples.

Each product sample contained the HydroFlex™ media as described in Example 1 with the designated amount of the sodium orthophosphate which is set forth in Table 5. All samples were mixed for 2 minutes to form a 50% aqueous slurry. The zinc samples were immersed in the slurry and the metal samples were removed from the slurry after 2 minutes. The metal samples were allowed to dry and the degree of discoloration was then noted. The results of the testing are set forth in Table 5.

TABLE 5

| SAMPLE No. | WT. % Na ORTHOPHOSPHATE | DEGREE OF DISCOLORATION |
|---|---|---|
| 1. | 0 | Noticeabily discolored |
| 2. | 0.02 | Noticeabily discolored |
| 3. | 0.04 | Slightly discolored |
| 4. | 0.06 | Very slighty discolored |
| 5. | 0.08 | No discoloration |
| 6. | 0.1 | No discoloration |
| 7. | 0.2 | No discoloration |
| 8. | 0.3 | No discoloration |
| 9. | 0.5 | No discoloration |

As can be seen from the test results, it is useful to provide greater than 0.02 wt. % of the sodium orthphosphate relative to the abrasive composition. At 0.08 wt. % soidum orthophosphate there was no discoloration of the samples.

What is claimed is:

1. A process for blast cleaning a metal surface wherein a blast media is directed by a fluid stream comprising water to said metal surface to remove contaminants therefrom, said blast media comprising an alkali metal salt particulate abrasive and a water soluble corrosion inhibitor, said corrosion inhibitor comprising an alkali metal phosphate.

2. The process of claim 1 wherein said abrasive and said corrosion inhibitor comprise separate free-flowing particles.

3. The process of claim 2 wherein said abrasive is water soluble.

4. The process of claim 3 wherein said abrasive comprises alkali metal carbonates, bicarbonates, sesquicarbonates or sulfates.

5. The process of claim 4 wherein said abrasive comprises sodium bicarbonate.

6. The process of claim 2 wherein said particulate abrasive has a size ranging from 10–1000 microns in diameter.

7. The process of claim 6 wherein no more than 1 wt. % of said abrasive particles have a size greater than 1,000 microns.

8. The process of claim 6 wherein said abrasive particles have a size range of from 50–500 microns in diameter and said corrosion inhibitor has a size no greater than 100 microns.

9. The process of claim 1 wherein said corrosion inhibitor comprises an alkali metal monobasic, dibasic or tribasic orthophosphate.

10. The process of claim 1 wherein said corrosion inhibitor comprises sodium orthophosphate.

11. The process of claim 1 wherein said metal surface comprises an automotive part.

12. The process of claim 11 wherein said part is a carburetor.

13. The process of claim 1 wherein said corrosion inhibitor comprises 0.03 to 5 wt. % of said blast media.

14. The process of claim 13 wherein said corrosion inhibitor comprises 0.05 to 2 wt. % of said blast media.

15. The process of claim 14 wherein said corrosion inhibitor comprises 0.08 to 2.0 wt. % of said blast media.

16. The process of claim 1 wherein said blast media further includes zinc.

17. The process of claim 11 wherein said zinc is in the form of a zinc salt.

18. The process of claim 1 wherein said fluid stream consists essentially of water.

19. The process of claim 1 wherein said fluid stream comprises a saturated aqueous solution and said abrasive is water soluble.

20. The process of claim 19 wherein said fluid stream further contains compressed air.

21. The process of claim 19 wherein said saturated aqueous stream has a pressure below 500 psi.

22. The process of claim 21 wherein said abrasive is sodium bicarbonate and said corrosion inhibitor is sodium orthophosphate.

23. The process of claim 1 wherein said fluid stream comprises compressed air and water added as a dust control agent.

24. The process of claim 1, wherein said metal is selected from the group consisting of aluminum, zinc, magnesium, copper and brass.

* * * * *